United States Patent [19]

Perrero et al.

[11] 3,711,782

[45] Jan. 16, 1973

[54] VHF AND MICROWAVE AMPLIFIER HAVING IMPROVED STABILITY AND CONTROLLABLE GAIN

[75] Inventors: George Perrero; Carroll E. Weller, both of Cincinnati, Ohio

[73] Assignee: Avco Corporation, Cincinnati, Ohio

[22] Filed: Jan. 26, 1971

[21] Appl. No.: 109,840

[52] U.S. Cl.......................330/30 R, 330/25, 330/29, 330/109, 330/110, 333/11

[51] Int. Cl...............................H03f 3/68, H01p 5/12

[58] Field of Search ..307/318; 330/25, 30, 109, 110; 333/11

[56] References Cited

UNITED STATES PATENTS

| | | | |
|---|---|---|---|
| 3,289,104 | 11/1966 | McClay et al. | 307/318 X |
| 3,014,995 | 12/1961 | Miller et al. | 330/25 X |
| 3,443,239 | 5/1969 | Schmitt | 330/25 |
| 3,371,284 | 2/1968 | Englebrecht | 330/30 R X |
| 3,381,244 | 4/1968 | Dalley | 333/11 X |

*Primary Examiner*—Roy Lake

*Assistant Examiner*—Lawrence J. Dahl

*Attorney*—Charles M. Hogan and Irwin P. Garfinkle

[57] ABSTRACT

A gain stabilized VHF and microwave power amplifier-attenuator having a hybrid coupled transistor pair. The amplifier-attenuator input comprises a 3 db, quadrature phase, directional coupler. The power amplifier output also comprises a 3 db, quadrature phase, directional coupler. A pair of class-A transistor amplifiers have their inputs connected to the output ports of the input coupler and their outputs connected to the input ports of the output coupler. Their bias power supply terminals are connected to a gain controlling source of bias power. Each of the transistor amplifiers has a feedback loop which comprises a zener diode operating in its zener region which is conductively connected from the output terminal of the amplifier to the input terminal of the amplifier. The gain of the amplifiers is stabilized by circuitry which automatically controls the voltage applied to the bias power supply terminals.

14 Claims, 3 Drawing Figures

INVENTORS
GEORGE PERRERO
CARROLL E. WELLER
BY
*Cennamo Kremblas & Foster*
ATTORNEYS INVENTORS
GEORGE PERRERO
CARROLL E. WELLER
BY
Cennamo Kremblas & Foster
ATTORNEYS

VHF AND MICROWAVE AMPLIFIER HAVING IMPROVED STABILITY AND CONTROLLABLE GAIN

BACKGROUND OF THE INVENTION

The invention relates to a VHF and microwave amplifier having improved stability and more particularly relates to an amplifier having a transistor pair, parallel coupled by means of 3 db, quadrature phase, directional couplers at both input and output. An improved negative feedback biasing circuit is utilized to provide adjustable gain which automatically compensates for variations in both stage gain and in voltage provided by the prime power supply.

Microwave electronic engineers are continuously seeking improved amplifiers with improved stability. They seek, for example, to maintain the input impedance of an amplifier constant over a broad frequency range so that impedance matching may be maintained and energy reflections may be minimized. It is also desirable that the amplifier characteristics do not shift with a change in temperature or with aging. Furthermore, it is useful to have an amplifier with a controllable gain so that the gain may be continuously varied within a range extending from considerable attenuation to considerable amplification without substantially effecting the other characteristics and electrical properties of the amplifier. The particular detailed problems now facing the prior art are described in more detail in the following description.

SUMMARY OF THE INVENTION

The invention is a stability improving d.c. feedback circuit for use in an amplifier having an active element. The active element has a common terminal, an input terminal and an output terminal. The feedback circuit comprises a zener diode conductively connected between the input terminal and the output terminal of the active element. The zener diode is connected in a polarity to assure operation in its zener region and provides a d.c. voltage at the input terminal substantially equal to the d.c. voltage of the output terminal less the zener voltage of the diode. By providing no substantial resistance interposed between the output terminal and the input terminal in the feedback circuit, substantially unit feedback is attained.

An RF choke is interposed in the feedback path for providing a large, high frequency impedance so that the unity feedback is solely d.c. feedback.

Such a feedback loop is utilized in each transistor amplifier of a microwave power amplifier having a transistor pair coupled by a pair of 3 db, quadrature phase, directional couplers. The gain of this microwave power amplifier may be varied over a broad range, while maintaining other amplifier characteristics stable, by varying the bias power supply voltage to the transistor pairs.

It is an object of the invention to provide an improved microwave power amplifier exhibiting a relatively constant input impedance over a broad range of gain and a wide frequency band.

Another object of the invention is to provide a microwave amplifier exhibiting excellent stability over a broad range of temperatures and throughout a long life.

Another object of the invention is to provide an amplifier in which the gain may be controlled within a range extending from substantial attenuation to substantial amplification without substantially varying the other characteristic of the amplifier.

Another object of the invention is to provide a quadrature hybrid coupled transistor pair having controllable gain.

Further objects and features of the invention will be apparent from the following specification and claims when considered in connection with the accompanying drawings illustrating the preferred embodiment of the invention.

Figure 1:
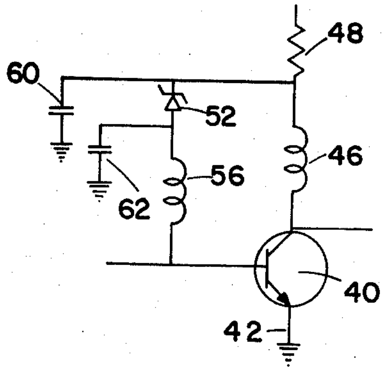
FIG. 1 is a schematic diagram illustrating the feedback circuit of the invention.

In describing the preferred embodiment of the invention illustrated in the drawings, specific terminology will be resorted to for the sake of clarity. However, it is not intended to be limited to the specific terms so selected and it is to be understood that each specific term includes all technical equivalents which operate in a similar manner to accomplish a similar purpose.

DETAILED DESCRIPTION

Figure 2:
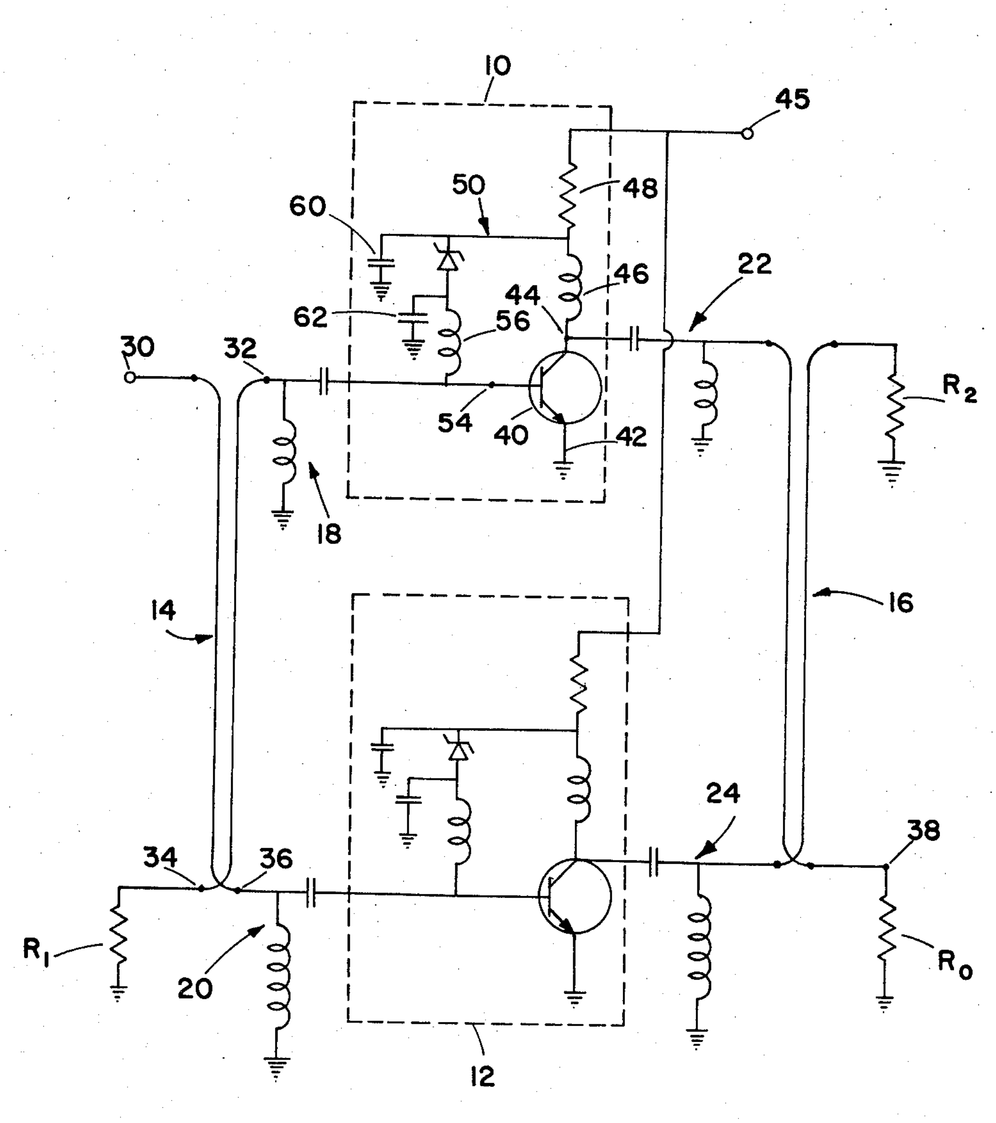
FIG. 2 is a schematic diagram of the preferred embodiment of the invention.

The circuit of FIG. 2 shows a pair of class-A, RF amplifiers 10 and 12 coupled to an input coupler 14, which is a 3 db, quadrature phase, directional coupler. The output of class-A amplifiers 10 and 12 are connected to an output coupler 16 which also is a 3 db, quadrature phase, directional coupler. The input impedance of the amplifier 10 is matched to the input coupler 14 at a midband frequency by an impedance matching L network 18. Similarly the input impedance of the amplifier 12 is matched to the output of the input coupler 14 by an impedance matching L network 20. In a similar manner the output impedances of the amplifiers 10 and 12 are matched to the inputs of the output coupler 16 by means of L networks 22 and 24. Thus, the L networks provide impedance matching in the conventional manner for a frequency near the middle of the operational band of the amplifiers.

The coupling properties of the 3 db, quadrature phase, directional coupler are well known. If energy is applied to the input terminal 30 of the input coupler 14 and if the input impedances of the amplifiers 10 and 12, as seen at the output terminals 32 and 36, are equal and if further the resistance $R_1$ is equal to the characteristics impedance of the coupler 14, then signal power applied at the input 30 of the coupler 14 will be divided equally between the output terminal 32 and the output terminal 36. The energy at the output terminal 36 will be phased at 90° with respect of the energy at the output terminal 32. Furthermore, all energy reflected due to slight mismatches, from the inputs of the amplifiers 10 and 12 back to the input coupler 14, will be directed to and dissipated in the resistance $R_1$. No net energy will be reflected back to the input terminal 30 which therefore presents a perfect impedance match. The transfer characteristics of the output coupler 16 are analogous to the characteristics of the input coupler 14.

When the amplifiers 10 and 12 present mismatches to the couplers 14 and 16, the couplers behave as isolators and dissipate reflected power in the resistances $R_1$ and $R_2$ so long as the mismatches are nearly equal and $R_1$ and $R_2$ are equal to the characteristic impedance of the couplers.

Insofar as the circuit of FIG. 2 has been described above, its operation is old and known in the art and provides suitable gain from the input terminal 30 to the output terminal 38.

The amplifier 10 has a transistor 40 having its emitter 42 connected directly to ground. Its collector terminal 44 is conductively connected to a bias power supply terminal 45 through an RF choke 46 and a collector resistor 48.

The amplifier 10 has a stability-improving feedback circuit for providing d.c. negative feedback from the collector circuit to the base circuit of the transistor 40. The feedback circuit comprises a zener diode 52 conductively connected between the input, base terminal 54 of the transistor 40 and the output terminal 44 of the collector of the transistor 40. The zener diode is conductively connected in the sense that it is connected through a feedback circuit, RF choke 56 and the collector RF choke 46.

There is no substantial resistance interposed between the output terminal 44 of the amplifier 10 and the input terminal 54. This fact, together with the presence of the RF choke, assures that unity d.c. feedback is provided from the collector to the base of the transistor 40. To further assure that high frequencies are not fed back to the base 54, thereby reducing amplifier gain, RF shunting capacitances 60 and 62 are connected from opposite sides of the zener diode 52 to ground. The zener diode 52 is connected in a polarity so that it will be operated in its zener region.

FIG. 1 shows the amplifier 10 removed from the circuit of FIG. 2. Amplifier 12 is substantially identical to the amplifier 10 and, therefore, is not separately described. It should be noted, however, that its bias power supply connection is connected to the bias power supply terminal 45 of the amplifier 10 so that both amplifiers 10 and 12 receive power from the same terminal at the same voltage. It is the voltage applied at the terminal 45 which will be varied to control the gain of the amplifier as described below.

Figure 3:
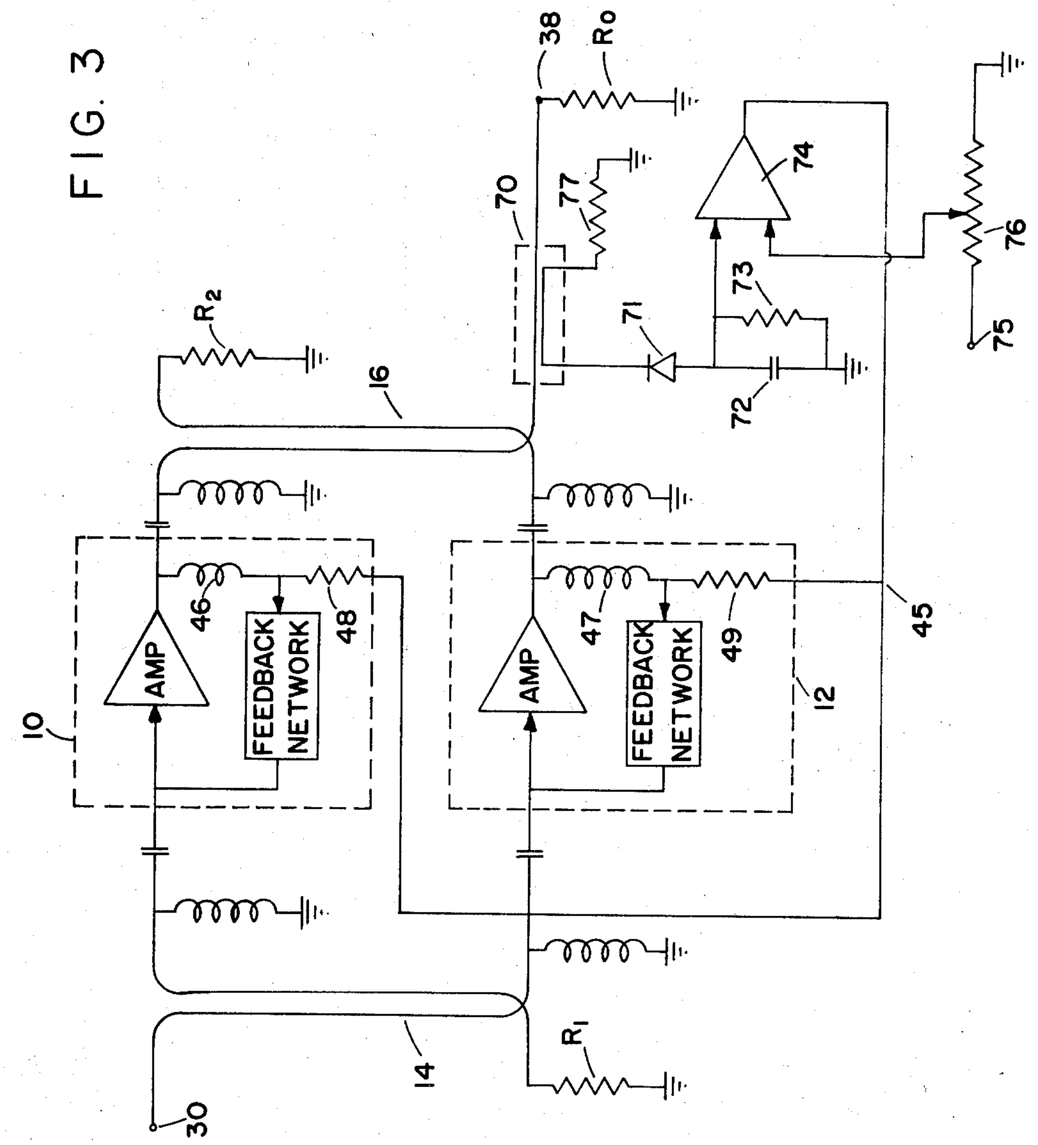
FIG. 3 is a schematic diagram of another embodiment of the invention.

In FIG. 3 we illustrate the gain control circuitry which is used to control the voltage at the terminal 45. A sample of the RF output is taken by directional coupler 70. Directional coupler 70 is terminated by its characteristic impedance as shown in resistor 77. The RF sample is rectified by use of diode 71 and the filter network made up of capacitor 72 and resistor 73. Thus, the d.c. voltage at the input of differential amplifier 74 is proportional to the amplitude of the signal at output terminal 38. The second input to differential amplifier 74 is taken from the variable terminal or potientiometer 76 whose maximum voltage swing is a function of reference voltage 75. The output of differential amplifier 74 serves as the input to terminal 45 of the hybrid coupled amplifier circuit. The gain parameters of the circuitry is determined by the setting of potientiometer 76.

There are several operational features of the circuit which permit the accomplishment of improved stability and controllable gain. Base bias for both transistor amplifiers 10 and 12 is derived from the d.c. voltage developed across their collector resistors such as 48 and applied to the bases such as 54 through the zener diodes such as 52. The input terminal voltage at the base terminal 54 is substantially equal to the d.c. voltage at the collector terminal 44 less the zener voltage of the zener diode. The unity d.c. feedback maintains the voltage at the collector 44 substantially constant regardless of the bias power supply voltage selectively applied at the terminal 45.

The d.c. collector current is, therefore, always equal to the voltage dropped across the collector resistance 48 divided by the resistance of the collector resistor 48. Therefore, the bias power supply voltage at the terminal 45 may be varied to vary the collector current without causing any significant change in the d.c. collector voltage or in the unity feedback. Variation of the d.c. collector current permits control of amplifier gain due to two factors. The forward transfer ratio $h_{fe}$ of the transistors changes as the d.c. collector current changes. A reduction in d.c. collector current reduces the transistor $h_{fe}$. Secondly, as the d.c. current is changed, the transistor input impedance changes, thus introducing additional mismatch between the transistor amplifiers and the couplers introducing reflection loss. Increased reflection means more power dissipated in the resistance $R_1$ and therefore, less amplification or greater attenuation. Thus, the stage gain of the amplifiers 10 and 12 may be controlled by variation of the voltage applied to the terminal 45 without substantially varying the operating point of the transistors or substantially changing the impedance seen at the input terminal 30 or the output terminal 38 of the microwave power amplifier. When the voltage applied to the terminal 45 is relatively low the circuit of FIG. 1 acts as an attenuator. When the voltage applied to the terminal 45 is relatively high, the circuit of FIG. 1 behaves as an amplifier. A continuum of control is available within this range.

Most class-A amplifiers employ emitter resistors for temperature stabilization. Such an emitter resistor is then bypassed by a capacitor to realize maximum stage gain at the operating frequency. With conventional class-A amplifiers, this permits the amplifier to operate over a large temperature range with negligible change in operating point. However, at frequencies approaching 100 mHz and greater, it is difficult if not impossible to bypass the emitter resistance with a capacitive reactance low enough to realize the maximum stage gain capability. The circuit illustrated in FIG. 1 operates with the emitter connected directly to ground. Thus, the need for such bypassing is eliminated and yet stability is maintained.

Finally, because of the properties of semiconductor junctions, the output capacitance of the transistor itself is related to the collector voltage. Because the output collector voltage of the transistors is maintained constant by the unity negative feedback, the output capacitance of the transistors is maintained very nearly constant.

The important over-all result of the circuitry is that, despite variations in the gain control voltage applied to the terminal 45, despite aging and despite temperature extremes, the gain can be controlled and yet the impedance of the amplifier modules 10 and 12 remain identical to each other. Therefore, the couplers 14 and 16 retain the properties described above. By maintaining the amplifier modules identical, the input impedance at the terminal 30 remains constant for all amplifier gains, all temperatures and all frequencies in the operating range of the circuit. Similarly, the characteristic output impedance at the terminal 38 of the circuit of FIG. 2 remains constant.

It is to be understood that while the detailed drawings and specific examples given describe a preferred embodiment of the invention, they are for the purpose of illustration only, that the apparatus of the invention is not limited to the precise details and conditions disclosed and that various changes may be made therein without departing from the spirit of the invention which is defined by the following claims.

What is claimed is:

1. A hybrid coupled transistor pair, VHF and microwave power amplifier-attenuator comprising:

a. an input 3 db, quadrature phase, directional coupler having an input port, two output ports and a fourth port terminated in an impedance match with the characteristic impedance of the coupler;

b. a first transistor amplifier having an input coupled to one output port of said input coupler, and having an output terminal and a bias power supply terminal;

c. a second transistor amplifier having an input coupled to the other output port of said input coupler and having an output terminal and a bias power supply terminal;

d. a pair of feedback loops, one such loop in each of said transistor amplifiers and each loop comprising a zener diode conductively connected from the output terminal of its amplifiers to the input terminal of its amplifier in a polarity to be operated in its zener region; and e. an output, −3 db, quadrature phase, directional coupler having a pair of input ports, each port coupled to one of the output terminals of one of said amplifiers, having an output port, and having a fourth port terminated in an impedance match with the characteristic impedance of the coupler.

2. A circuit according to claim 1 wherein there is no substantial resistance interposed between said output terminal and said input terminal in order to provide substantially unit feedback.

3. A circuit according to claim 1 wherein both of said bias power supply terminals are connected to a variable voltage power supply means for controlling the gain of said amplifiers by selecting the voltage applied to said bias power supply terminals.

4. A circuit according to claim 1 wherein a feedback circuit RF choke is interposed between said diode and said input terminal.

5. A circuit according to claim 1 wherein an RF shunting capacitance is connected from one terminal of said diode to said common terminal.

6. A circuit according to claim 5 wherein a second RF shunting capacitance is connected from the other terminal of said zener diode to said common terminal.

7. A circuit according to claim 1 wherein said output is series connected, in order, to an output circuit RF choke, resistance, and a source of bias power.

8. A circuit according to claim 7 wherein said zener diode is conductively connected to said output terminal at the node between said output circuit RF choke and said d.c. load resistance.

9. A circuit according to claim 8 wherein a feedback circuit RF choke is interposed between said diode and said input terminal.

10. A circuit according to claim 9 wherein an RF shunting capacitance is connected from one terminal of said diode to said common terminal.

11. A circuit according to claim 10 wherein a second RF shunting capacitance is connected from the other terminal of said zener diode to said common terminal.

12. A stability improving feedback circuit for use in an amplifier having an active element, the gain of said amplifier being a function of the level of the current operating point of said element, said active element having a common terminal, an input terminal and an output terminal, said circuit comprising:

a feedback circuit including an RF choke and a zener diode conductively connected between the input terminal and the output terminal of said active element, said zener diode being connected in a polarity to assure operation in its zener region for providing a d.c. voltage at said input terminal substantially equal to the d.c. voltage of said output terminal less the zener voltage of said diode, said feedback circuit having no substantial resistance interposed between said output terminal and said input terminal, thereby providing substantially unity feedback at d.c. and very low frequencies while providing a high impedance to signal frequencies;

a source of variable direct voltage resistively connected to the output terminal of said active element for dynamically controlling the current supplied to said elements, the voltage output of said source varying with applied direct currents; and means for applying a rectified portion of the signal output of said amplifier to said source.

13. The invention as defined in claim 12 wherein said source of variable direct voltage comprises a reference comparison circuit, the output of said reference comparison circuit being resistively connected to said output terminal of said element to control the gain of said amplifier.

14. The invention as defined in claim 12 wherein said source is a differential d.c. amplifier having a reference d.c. input terminal and a signal level sample input terminal, the output from said differential d.c. amplifier being a direct voltage whose value is a function of the difference between the direct voltages applied to said terminals, said reference d.c. input terminal being connected to a d.c. voltage source, said portion of the signal output of said amplifier being coupled through a rectifier to said signal input terminal.

* * * * *